United States Patent
Parkinson

(10) Patent No.: US 7,961,495 B2
(45) Date of Patent: Jun. 14, 2011

(54) PROGRAMMABLE RESISTANCE MEMORY WITH FEEDBACK CONTROL

(75) Inventor: Ward Parkinson, Boise, ID (US)

(73) Assignee: Ovonyx, Inc., Troy, MI (US)

( * ) Notice: Subject to any disclaimer, the term of this patent is extended or adjusted under 35 U.S.C. 154(b) by 174 days.

(21) Appl. No.: 12/287,986

(22) Filed: Oct. 15, 2008

(65) Prior Publication Data

US 2010/0091559 A1   Apr. 15, 2010

(51) Int. Cl.
*G11C 11/00*   (2006.01)

(52) U.S. Cl. .................... 365/148; 365/163

(58) Field of Classification Search .............. 365/148, 365/163
See application file for complete search history.

(56) References Cited

U.S. PATENT DOCUMENTS

2007/0121368 A1 * 5/2007 Gilbert .................. 365/148
* cited by examiner

*Primary Examiner* — Huan Hoang
(74) *Attorney, Agent, or Firm* — Kevin L. Bray

(57) ABSTRACT

A programmable resistance memory employs a feedback control circuit to regulate the programming current supplied to a selected programmable resistance memory element. The programmable resistance memory may be a phase change memory. The feedback control circuit monitors and controls the characteristics of a current pulse employed to program a memory cell.

23 Claims, 8 Drawing Sheets

PROGRAMMABLE RESISTANCE MEMORY WITH FEEDBACK CONTROL

FIELD OF INVENTION

This invention relates to electronic memory circuits.

BACKGROUND OF THE INVENTION

As electronic memories approach limits beyond which they will no longer be able to produce the density/cost/performance improvements so famously set forth in Moore's law, a host of memory technologies are being investigated as potential replacements for conventional silicon complementary metal oxide semiconductor (CMOS) integrated circuit memories. Among the technologies being investigated are phase change memory technologies. Phase-change memory arrays are based upon memory elements that switch among two material phases, or gradations thereof, to exhibit corresponding distinct electrical characteristics. Alloys of elements of group VI of the periodic table, such as Te, S or Se, referred to as chalcogenides or chalcogenic materials, can be used advantageously in phase change memory cells. In the chalcogenides, the resistivity may vary by two or more orders of magnitude when the material passes from the amorphous (more resistive) phase to the crystalline (more conductive) phase, and vice versa. Further, the resistivity of the chalcogenide materials generally depend on the temperature with the amorphous state generally being more temperature dependent than the crystalline state.

A chalcogenide memory device may utilize the wide range of resistance values available for the material as the basis of memory operation. Each resistance value corresponds to a distinct structural state of the chalcogenide material and one or more of the states can be selected and used to define operation memory states. Chalcogenide materials exhibit a crystalline state, or phase, as well as an amorphous state, or phase. Different structural states of a chalcogenide material differ with respect to the relative proportions of crystalline and amorphous phase in a given volume or region of chalcogenide material. The range of resistance values is generally bounded by a set state and a reset state of the chalcogenide material. By convention, the set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Phase change may be induced by increasing the temperature locally. Below 150° C., both of the phases are stable. Above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C. for GST 225) and then cool it off rapidly, i.e. quench. From the electrical standpoint, it is possible to reach the crystallization and melting temperatures by causing a current to flow through a crystalline resistive element that heats the chalcogenic material by the Joule effect.

Each memory state of a chalcogenide memory material corresponds to a distinct range of resistance values and each memory resistance value range signifies unique informational content. Operationally, the chalcogenide material can be programmed into a particular memory state by providing an electric current pulse of an appropriate amplitude and duration to transform the chalcogenide material into the structural state having the desired resistance. By controlling the amount of energy provided to the chalcogenide material, it is possible to control the relative proportions of crystalline and amorphous phase regions within a volume of the material and to thereby control the structural (and corresponding memory) state of the chalcogenide material to store information.

Each memory state can be programmed by providing the current pulse characteristics of the state and each state can be identified, or "read", in a non-destructive fashion by measuring the resistance. Programming among the different states is fully reversible and the memory devices can be written and read over a large number of cycles to provide robust and reliable operation. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774,387; 6,687,153; and 6,314,014; the disclosures of which are incorporated by reference herein, as well as in several journal articles including, "Low Field Amorphous State Resistance and Threshold Voltage Drift in Chalcogenide Materials," published in EE transactions on Electron Devices, vol. 51, p. 714-719 (2004) by Pirovana et al.; and "Morphing Memory," published in IEEE Spectrum, vol. 167, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that govern the behavior of chalcogenide materials. The references also describe the structural transformations from the crystalline state to the amorphous state (and vice versa) via a series of partially crystalline states in which the relative proportions of crystalline and amorphous regions vary during the operation of electrical and optical programming of chalcogenide materials.

A wide range of chalcogenide compositions has been investigated in an effort to optimize the performance characteristics of chalcogenic devices. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. The role of modifying elements includes providing points of branching or cross-linking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may be deposited with a reactive sputtering process with gasses such as N2 or O2: forming a chalcogenide nitride, or oxide, for example and chalcogenide may be modified by an ion implantation or other process.

Early work in chalcogenide devices demonstrated electrical switching behavior in which switching from an "off" resistive state to an "on" conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching at ultrafast switching speeds. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures," Physical Review Letters, vol. 21, p. 1450-1453 (1969) by S. R. Ovshinsky; "Amorphous Semiconductors for Switching, Memory, and Imaging Applications," IEEE Transactions on Electron Devices, vol. ED-20, p. 91-105 (1973) by S. R. Ovshinsky and H. Fritzsche; the disclosures of which are hereby incorporated by reference. Three-terminal OTS devices are disclosed, for example, in U.S. Pat. Nos. 6,969,867 and 6,967,344; the disclosures of which are hereby incorporated by reference.

Although highly efficient and cost effective, process methods and device structures that reduce the cost of phase change memories would be highly desirable.

SUMMARY OF THE INVENTION

A programmable resistance memory in accordance with the principles of the present invention employs a feedback control circuit to regulate the programming current supplied to a selected programmable resistance memory element. The feedback control circuit may regulate current supplied to memory cells for binary or multi-level operation, for example. Such a circuit may be used to program any or all logic levels employed by a programmable resistance memory.

In an illustrative embodiment, the programmable resistance memory is a phase change memory. Such a memory may employ a chalcogenide material that exhibits different resistances, corresponding to different memory states, according to the degree to which the phase change material is crystallized (or amorphized). In accordance with the principles of the present invention, a feedback control circuit monitors and controls the characteristics of a current pulse employed to program a memory cell to its highest-resistance state, a level referred to, by convention, as the RESET state. To accommodate the programming characteristics of a variety of memory cells, a programming circuit in accordance with the principles of the present invention ensures that all cells within an array are programmed to the RESET state by ensuring that the least-readily RESETable memory cell receives sufficient current to melt an active volume of the phase change material within the cell. Additionally, the circuit controls the shape of the current-pulse to ensure such programming, generally, by rapidly withdrawing, that is, "quenching," the programming current. Quenching the programming current rapidly cools the phase change material thereby "freezing" it in a substantially amorphous state.

The minimum amplitude of a current pulse required to bring the phase change material within all memory cells within an array to the material's melting temperature, $T_{EMELT}$, may be referred to herein as $I_{RESET}$. The value of this current-pulse amplitude may be determined during manufacturing test or during a built-in self test implemented by the manufacturer or in the field by on-chip or telecom means, for example. Parameter values related to other program states, whether a full SET state or an intermediate state employed in a multi-level cell embodiment, may be similarly determined during manufacturing test, built-in self test, or other means. One or more of such parameter values may be related to the value of $I_{RESET}$. For example, the amplitude of the SET programming current may be limited to no more than a percentage (e.g. 75%) of $I_{RESET}$ and the feedback control circuit may initiate quenching of a sweep current pulse at another percentage (e.g., 25%) of $I_{RESET}$.

In an illustrative embodiment a memory in accordance with the principles of the present invention performs a self-test during which it optimizes $I_{RESET}$, setting $I_{RESET}$ to a value equal to that required for the least-readily RESET cell within the array. A margin (5%, 10%, 20%, for example) may be added to the nominal value in order to ensure proper operation over time and throughout an environmental range. In addition to optimizing the value of $I_{RESET}$ in this manner, the upper bound for a non-RESET programming current, the falling edge rate for one or more non-RESET programming levels, and the lower current-level quench point for one or more non-RESET programming levels may all be optimized during a test, such as a factory test or a self test, for example. Feedback control parameters associated with those optimized operating points may be stored in conjunction with such optimization.

The trailing edge rate of a sweep current pulse may be related to one or more program levels, with the slowest rate of decline associated with a full SET level and one or more other rates of decline in programming current each associated with intermediate storage levels. The term "trailing edge rate" will be used herein in reference to the rate at which current supplied to a memory cell declines during the course of programming the cell.

In illustrative embodiments, a memory in accordance with the principles of the present invention applies a peak programming current to a selected cell to generate a peak temperature within the cell, then diminishes the current through the cell to reduce the temperature within the cell. A feedback control circuit in accordance with the principles of the present invention may operate to control the rate (increasing or decreasing) at which current through the cell is reduced, thereby controlling the time the cell spends at different temperatures as the current through the cell generally diminishes. In this manner, time at a preferred temperature or temperature range may be maximized. For example, time at or near the temperature at which phase change material is crystallized at a maximum rate $T_{EOPTIMAL}$ may be maximized. In an illustrative embodiment, time in the nose region (a region centered at $T_{EOPTIMAL}$ and spanning a range of 100° C.) may be maximized.

A memory that employs feedback control circuitry in accordance with the principles of the present invention may be particularly suitable for operation in a variety of electronic devices, including cellular telephones, radio frequency identification devices (RFID), computers (portable and otherwise), solid state drives (SSDs), location devices (e.g., global positioning system (GPS) devices, particularly those that store and update location-specific information), and handheld electronic devices, including personal digital assistants (PDAs), and entertainment devices, such as MP3 players, for example.

DETAILED DESCRIPTION

Although this invention will be described in terms of certain preferred embodiments, other embodiments that are apparent to those of ordinary skill in the art, including embodiments that do not provide all of the benefits and features set forth herein, are also within the scope of this invention. Various structural, logical, process step, chemical, and electrical changes may be made without departing from the spirit or scope of the invention. Polarities and types of devices and supplies may be substituted in a manner that would be apparent to one of reasonable skill in the art. Accordingly, the scope of the invention is defined only by reference to the appended claims.

Figure 1:
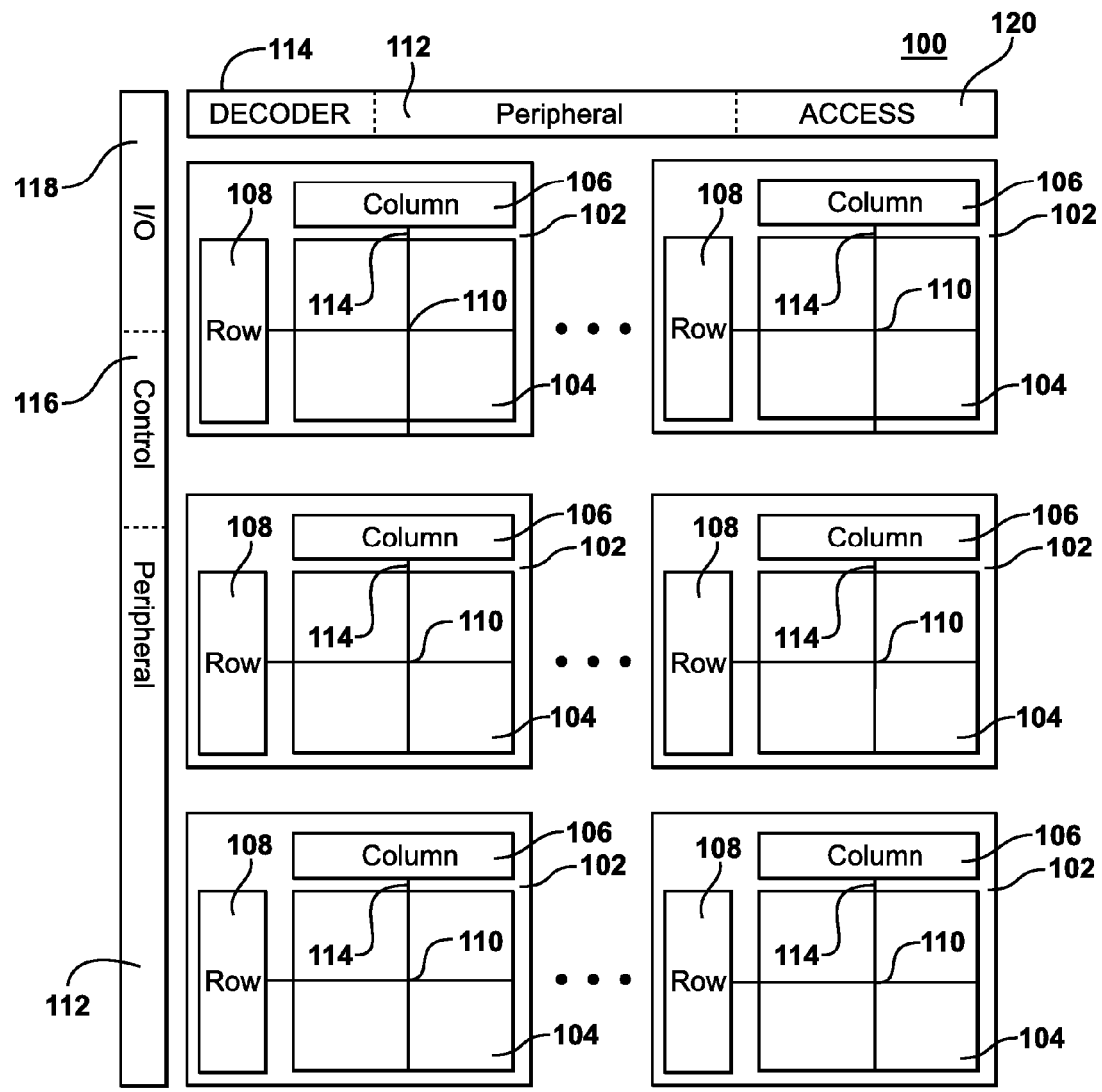
FIG. 1 is a block diagram of a programmable resistance memory array in accordance with the principles of the present invention.

The conceptual block diagram of FIG. 1 provides a functional level view of an illustrative programmable resistance memory circuit 100 in accordance with the principles of the present invention. In this illustrative embodiment, a programmable resistance memory circuit 100 includes at least one array of programmable resistance memory cells arranged as a storage matrix tile 102, along with peripheral circuitry 112 that, in combination, yields the standalone programmable resistance memory circuit 100. The programmable resistance memory cells of the storage matrix 104 may be implemented as, for example, phase change memory cells.

The memory circuit 100 includes row drivers 108 and column drivers 106 configured to access cells within the storage matrix 104. In accordance with the principles of the present invention, peripheral circuitry 112 includes feedback control circuitry configured to regulate the programming current supplied to a selected programmable memory element. As described in greater detail in the discussion related to FIGS. 2 through 5C, the feedback control circuit may regulate current supplied to memory cells for binary or multi-level operation. Row-address, column-address and data latches may also be included in the peripheral circuitry 112.

Accesses carried out by the row 108 and column 106 drivers include reading from the memory cells of the matrix 104 and writing to the memory cells of the matrix 104. Peripheral circuitry 112 includes decoding circuitry 114 which accepts address signals from another electronic device, such as a controller, for example, and decodes the address signals to determine which of the row 108 and column 106 drivers to activate and, thereby, which of the memory cells within the array 104 to access. Access circuitry 120, including current sources for row 108 and column 106 drivers are described in greater detail in the discussion related to FIGS. 2 and 3. Control signals developed for the memory 100 may include data direction control information (e.g., READ "from" or WRITE "to" the storage matrix tile 102) and may include storage level control information (e.g., WRITE 00, 01, 10, or 11).

Figure 2:
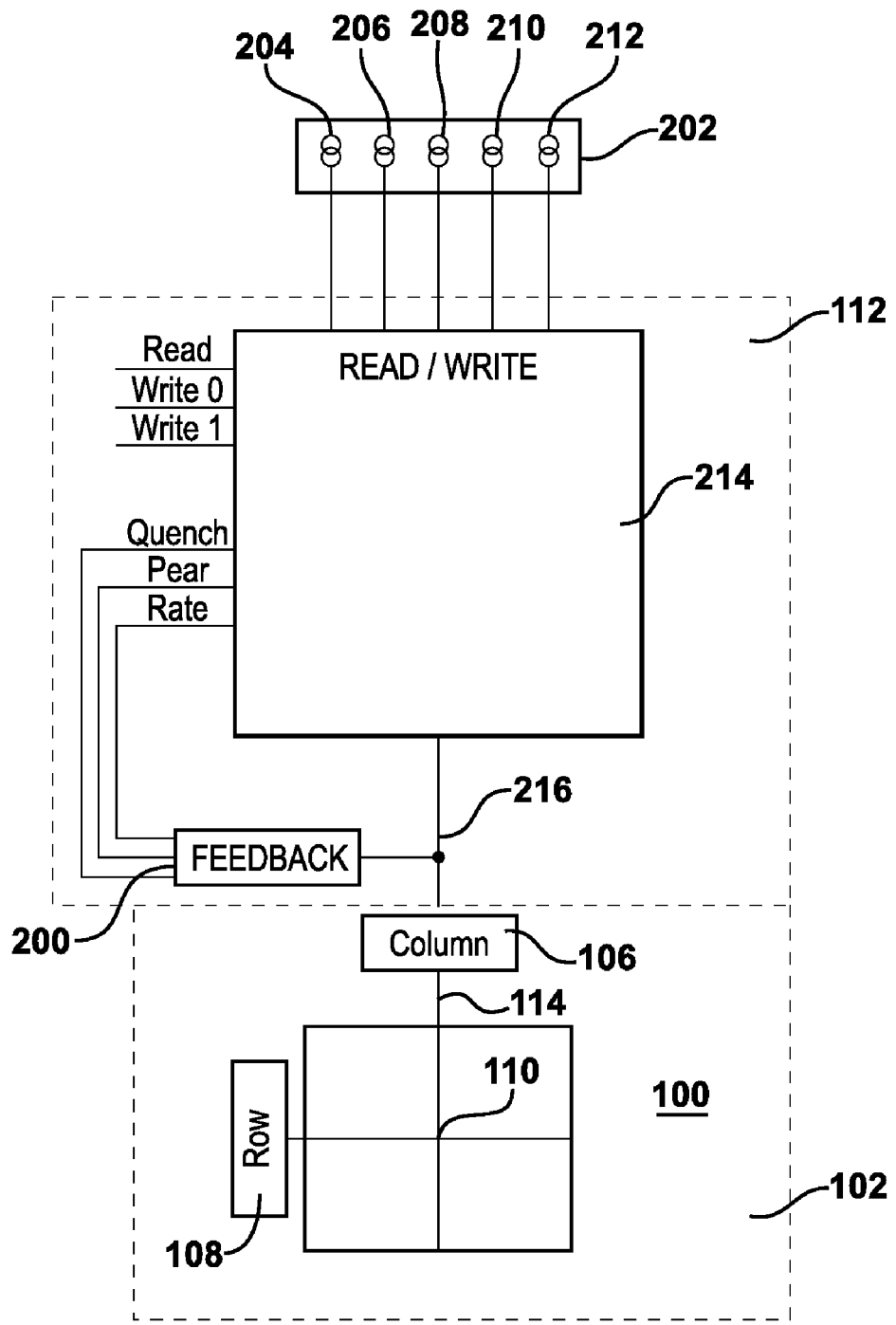
FIG. 2 is a block diagram of a programmable resistance memory in accordance with the principles of the present invention, including a feedback control circuit.

The block diagram of FIG. 2 provides a more detailed view of peripheral circuitry 112 which forms a part of a programmable resistance memory in accordance with the principles of the present invention. In particular, feedback control circuitry 200 in accordance with the principles of the present invention is illustrated in the context of a programmable resistance memory 100. In this illustrative embodiment peripheral circuitry 112 includes current sources 202, including READ 204, WRITE00 206, WRITE01 208, WRITE10 210, and WRITE11 212 current sources.

Although, in this embodiment, current sources are illustrated as a part of a programmable resistance memory in accordance with the principles of the present invention, one or more of the current sources may be located "off-chip." By "off-chip" we mean circuitry that is physically separate from the integrated circuit that forms the memory. In an embodiment in which current sources are located off-chip, a memory in accordance with the principles of the present invention would include input circuitry configured to receive and distribute current from the off-chip current sources, including through the use of A/D to transfer on-chip read current on or off-chip for reading and processing, and on or off-chip D/A circuits for programming the on-chip current sources to write.

In accordance with the principles of the present invention, the current sources 202 may include dedicated sources, one for READ and one for each logic level, as illustrated, or a single source may be provided. The capacity of each current source may be such that it is just sufficient to meet the maximum requirements of its associated read or write function or, particularly in the case of a single current source embodiment, the current source may feature a capacity that is sufficient to meet the maximum requirements of all the read and write operations. As will be described in greater detail in the discussion related to the following Figures, the feedback control circuit 200 may take advantage of test results (which could be "on-chip," built in self tests, tests conducted under external control, or a combination) to optimize operation of the memory to reduce programming time or to provide a narrower distribution of programmed values by controlling peak current value, the rate at which current is diminished, or the level at which current is terminated, for example. Such techniques may include write, read, verify, re-write to adjust the programmed resistor—using techniques familiar to those reasonably skilled in the art. Such adjusting may be by programming both the amplitude as well as the trailing edge rate of the current pulse applied.

In this illustrative embodiment READ/WRITE control circuitry 214 accepts input signals indicative of the type of memory access to be performed (READ, WRITE00, WRITE10, for example) and directs the appropriate current source through to the column common 216. In this illustrative embodiment column common 216 is a node to which all column lines within one or more storage matrix tiles 102 are connected. Current supplied to column common 216 is directed to a selected column line within a storage matrix tile 102 via operation of column selection (decode) circuitry 106. In this illustrative embodiment, feedback control circuitry 200 in accordance with the principles of the present invention monitors the column common node 216 and controls current presented to the node 216.

The feedback control circuit 200 may provide control of such programming current parameters as peak current level, current level rate of decline and current quench level. Such control may be applied to READ or WRITE operations, for example. Operation using such parameters will be described in greater detail in the discussion related to FIGS. 4A through 5C. In accordance with the principles of the present invention the current supplied to the column common node 216 is monitored at a time when the current characteristics monitored at the common node accurately reflect characteristics present on the selected column line: during a column line access for example. In other embodiments in accordance with the principles of the present invention, a plurality of feedback control circuits may be employed to monitor current characteristics for individual column lines or one of a group of column lines. Common column 216 may be a mux (either N or P-channel, or both) enabled by the column selection circuit 106.

Figure 3:
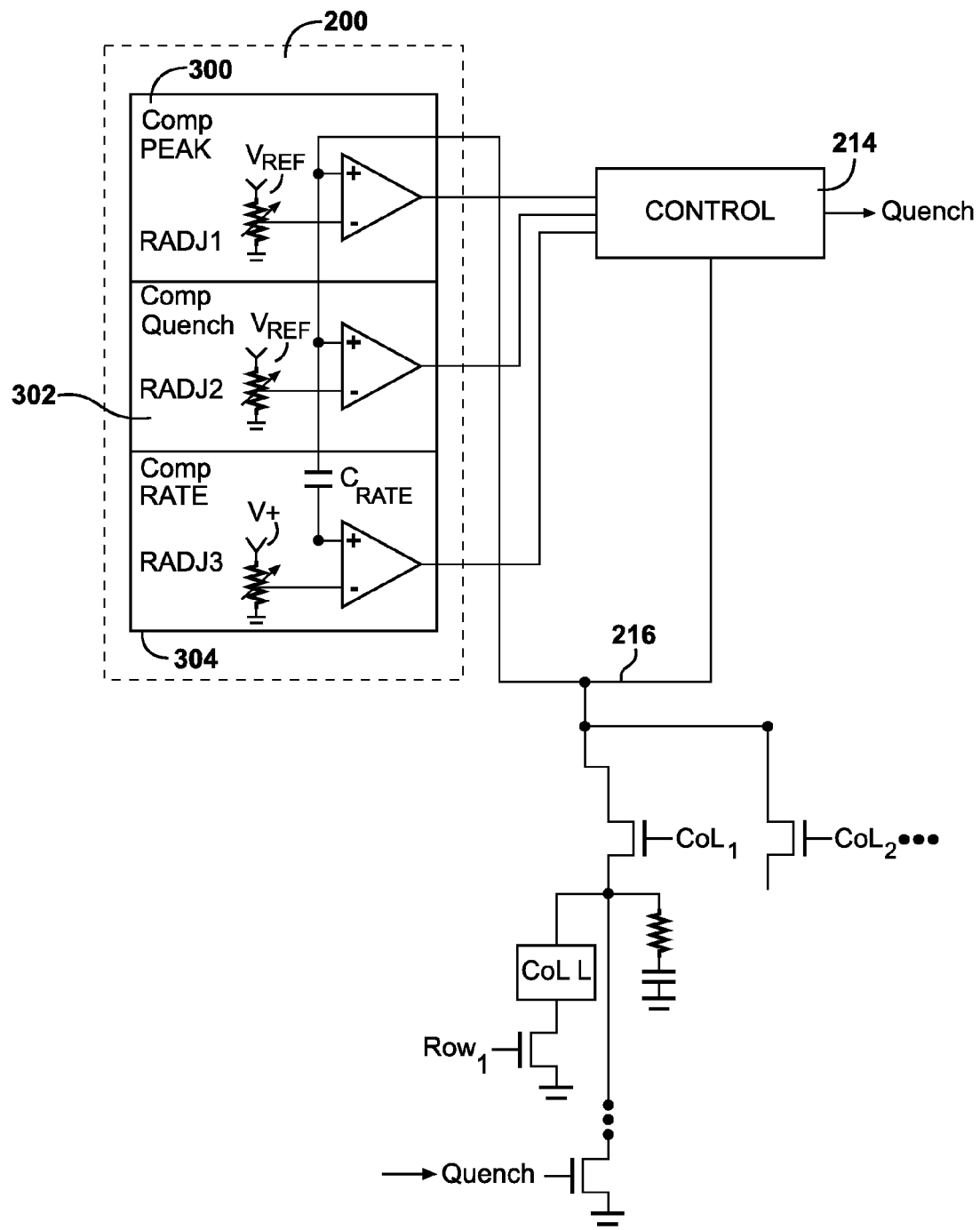
FIG. 3 is a block diagram of a programmable resistance memory in accordance with the principles of the present invention, providing a more-detailed view of the feedback control circuit.

The circuit/block diagram of FIG. 3 provides a more-detailed view of feedback control circuitry such as may be employed in a programmable resistance memory in accordance with the principles of the present invention. A peak current comparator circuit 300 includes an adjustable voltage reference voltage, shown as an adjustable resistor $R_{ADJ1}$ coupled between a reference voltage $V_{peak}$ and circuit common. The output of the adjustable voltage reference is coupled to the inverting input of comparator $COMP_{PEAK}$. The non-inverting input of the comparator $COMP_{PEAK}$ is, either directly, or in effect coupled to the column common node 216 through the control circuitry. The output of the comparator $COMP_{PEAK}$ is supplied to the control block 214, where it shuts off current supplied to the column common node 216 when current into a selected memory cell reaches a predetermined cutoff level at which current supplied from the current sources 202 is gated off by circuitry (not shown) within the control block 214. The cutoff level may be set to ensure that the programmable resistance material in all memory cells within an array reach a prescribed temperature for an associated function. The cutoff level may be set to one value for programming memory cells to a high resistance level and to one or more other levels for programming memory cells to lower resistance levels.

As will be described in greater detail in the discussion related to FIGS. 4A through 5C, because the thermal and mechanical characteristics of individual programmable resistance memory cells may vary from one to another within a large array of memory cells, the current required to bring an active volume of programmable resistance material to the material's melting temperature $T_{EMELT}$ within operational cells will vary from one cell to another. In order to ensure that an active volume of material within every memory cell reaches $T_{EMELT}$, the cutoff value, corresponding to a current referred to herein as $I_{RESET}$, is set so that even the least-readily programmed memory cell (that is, the cell that is least readily amorphized in this context) receives sufficient current to RESET the cell. Some margin may be added to the current value in order to ensure proper operation under varying circumstances, such as varying temperatures, for example. In illustrative embodiments the margin, also referred to herein as "over-reset", which could be set in a range of up to 100% of IRESET or more.

The value of IRESET, associated current values, and margins may be chosen on a lot by lot basis, for example, testing sample devices within a manufacturing lot and storing the resultant values within all memory devices in a manufacturing lot for use by a feedback control system in accordance with the principles of the present invention. Narrower margins, and higher performance, may be obtained by testing some or all individual programmable resistance memories during the manufacturing process and storing current-related feedback parameters for each device. Such manufacturing test may be, to varying degrees, initiated and performed by testers external to the memory devices itself, with on-chip built in self test circuitry supplementing the operation of the external tester, and used to reject or adjust a chip at the factory or in the field.

In an illustrative embodiment, built in self test circuitry on each memory device in accordance with the principles of the present invention incorporates built in self test circuitry that establishes read and write current feedback control parameter values. Such self-tests may be performed in response to external stimuli such as an operating system or memory controller command or input from a user, for example. In another aspect of the invention, built in self tests may be conducted to regularly update feedback control parameter values. Such values may be performed during a power-on sequence or during scheduled "down time," for example. By regularly updating such parameter values, a feedback control circuit may be adjusted according to aging and environmental factors to optimize operation of a programmable resistance memory in accordance with the principles of the present invention.

In accordance with the principles of the present invention the cutoff level employed by the comparator COMPPEAK may be adjusted according to the operation to be performed. For example, the highest cutoff level may be reserved for programming a selected memory cell to the highest resistance level, referred to herein as the RESET resistance level, the lowest cutoff level may be reserved for reading a selected cell, another current cutoff level may be assigned to programming a selected memory cell to a lowest resistance state, referred to herein as a SET state. Other, intermediate, resistance states may be programmed using cutoff current levels specifically assigned to them.

One current cutoff level, corresponding to $I_{RESET}$, could be used for all programming levels, with different resistances, or programming states, determined by the rate at which current, and, correspondingly, temperature, declines within a selected memory cell. However, in order to reduce the time required to program cells to a lower resistance state, such as a SET or intermediate resistance state, a feedback control programmable resistance memory in accordance with the principles of the present invention may employ a current cutoff level that is less than IRESET, such as 20% less than IRESET.

Programming times may also be reduced by precisely controlling the falling edge rate of a programming current pulse. Programming times may also be reduced by quenching programming current as soon as a target resistance has been reached, rather than simply allowing the current pulse to decay at its natural rate. For these reasons, a feedback control programmable resistance memory in accordance with the principles of the present invention may include a comparator circuit $COMP_{QUENCH}$ 302 that initiates a quench (that is, diverts current from the accessed memory cell or reduces it to zero current) as soon as the cell is programmed to a target state, rather than allowing the current to decay naturally.

In an illustrative embodiment an adjustable reference voltage, symbolized by an adjustable resistor $R_{ADJ2}$ coupled between a reference voltage $V_{REF}$ and circuit common, is applied to the inverting input of the comparator $COMP_{QUENCH}$. The non-inverting input of the comparator is configured to receive a signal from the column common, reflective of the current through a selected memory cell. The output of the comparator $COMP_{QUENCH}$ is fed to the control block 214 where it initiates the termination of a programming current pulse when the voltage indicates that a programming current pulse has decayed to a predetermined level. That predetermined level may be established, as previously described, during manufacturing or self-test.

Because the comparator is level-triggered, it will be triggered whenever the voltage applied to its non-inverting input is less than or equal to the quench reference QUENCHREF signal applied to its inverting input. Because this condition may apply at times other than when programming current is decaying, the control block includes enable circuitry that blocks the quenching action of the comparator COMP$_{QUENCH}$ at times other than a programming current's decay period: while a current pulse is building, for example.

To effect a quench, a memory in accordance with the principles of the present invention may include one or more quench transistors Q$_{QUENCH}$ coupled to a column line in a manner that diverts current from a selected memory cell, memory cell 1,1, (row 1, column 1) in this illustration as the current is optionally turned off. In this illustrative embodiment the memory cell is modeled as a variable resistance R$_{CELL}$ in series with an isolation device D$_I$. The distributed column line resistance RD and column line capacitance CD are modeled as an RC in parallel with the memory cell. The application of an access current (that is, READ or WRITEx current) to the selected column line charges the RC and, when an individual memory cell on the column line is selected by operation of a row transistor QR, the charge accumulated on the line RC is discharged through the selected memory cell. In addition, current still being supplied through the control block 112 is directed through the selected memory cell 1,1.

After the column line is charged, the control signal to the quench transistor QQUENCH is enabled and, when the current through the selected memory cell falls to a level that creates a voltage at the column common node equal to the QUENCHREF signal, the comparator COMPQUENCH triggers and, through the control block 112, turns the quench transistor QQUENCH on, thereby diverting current from the selected memory cell and rapidly terminating the programming operation. In alternative embodiments, a plurality of comparators, each with different cutoff levels, may be employed to terminate current into a selected memory cell at a different level, depending upon the type of access being made.

As will be described in greater detail in the discussion related to FIGS. 4A through 5C, careful control of the peak current level, the falling edge rate of the current, and the current termination level permit a feedback control programmable resistance memory in accordance with the principles of the present invention to operate more accurately and to program cells more rapidly. More accurate operation is afforded by precision programming and better margins that result from tighter control of such parameters.

Faster programming results from reducing the peak current, thereby reducing the time required to raise a memory cell's access current to a predetermined level; from precisely controlling the access current's falling edge rate, also referred to herein as the decay rate, rapidly establish and maintain a preferred programming temperature range within a selected cell for a prescribed period; and from quickly terminating (that is, quenching) the programming current once the cell has been exposed to an optimal programming temperature range for a prescribed period of time. Such advantages will be described in greater detail in the discussion related to FIGS. 4A through 5C.

A memory in accordance with the principles of the present invention may include a comparator circuit COMP$_{RATE}$ 304 that monitors the falling edge rate of programming current and ensures that the rate is appropriate for the desired programming state. In the illustrative embodiment of FIG. 3 an adjustable reference voltage symbolized by the adjustable resistor R$_{ADJ3}$ supplies a signal V$_{RATE}$ to the inverting input of the comparator COMP$_{RATE}$. The column common node is capacitively coupled through capacitor C$_{RATE}$ to the non-inverting input of the comparator COMP$_{RATE}$. A pullup resistor R$_{PULLUP}$ pulls the non-inverting input of the comparator COMP$_{RATE}$ to a positive voltage V$^+$ or to ground.

The output of the comparator COMP$_{RATE}$ is supplied to the control block 214 and used by the control block 214 to modulate current flow to a memory cell selected for programming. In particular, if current flow to a selected memory cell declines too rapidly, the non-inverting input to the comparator COMP$_{RATE}$ will be pulled below the level at the inverting input, driving the output of the comparator COMP$_{RATE}$ low and thereby causing the control block 214 to increase the current supplied to the selected memory cell. The control block circuitry could be implemented using a P-channel FET connected to the current sources and enabled by the output of the peak-sensing comparator COMP$_{PEAK}$, for example. Using the output of the peak-sensing comparator to enable the rate-sensing comparator COMP$_{RATE}$ ensures that the rate-sensing comparator only operates along the falling edge, or decay, of a programming current pulse. The output of the quench comparator COMP$_{QUENCH}$ may also be employed to enable/disable the output of the rate-sensing comparator COMP$_{RATE}$ to ensure that rapid quenching of a column line does not cause the COMP$_{RATE}$ output to inject more current into the column line.

As is known in the art, the time required to crystallize a particular phase-change material varies with temperature. The effects of temperature on a phase change material's rate of crystallization is described, for example, in U.S. Pat. No. 6,687,153, entitled, "PROGRAMMING A PHASE-CHANGE MATERIAL MEMORY," issued Feb. 3, 2004 to Lowrey, which is hereby incorporated by reference.

Figure 4A:
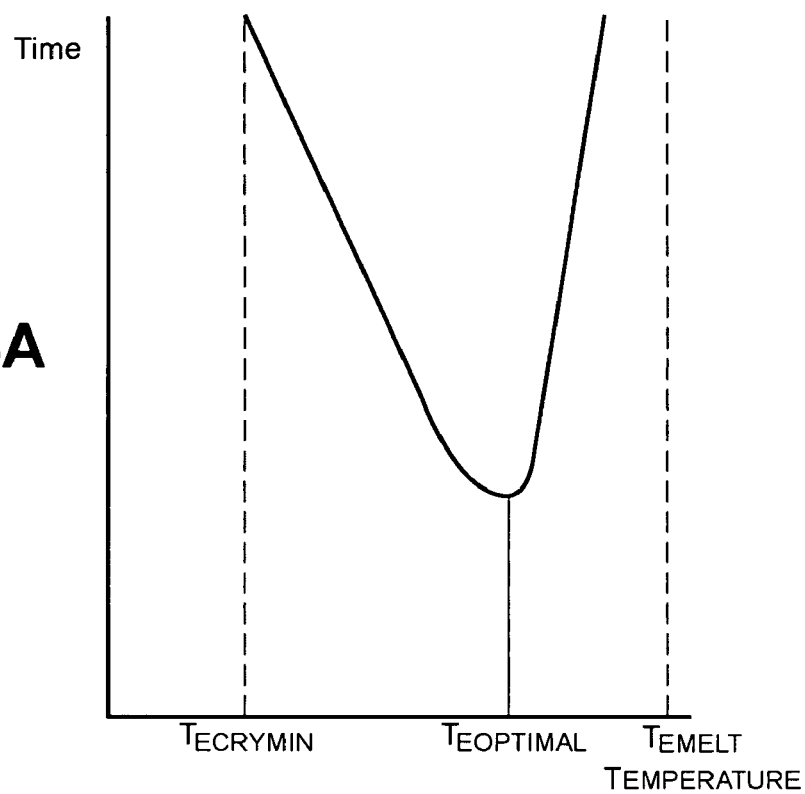
FIGS. 4A-4D are graphical representations of time-at-temperature for programming methods in accordance with the principles of the present invention.

The graphical representation of FIG. 4A is a plot of temperature versus crystallization time for an illustrative phase change material. Temperature is plotted along the abscissa and cumulative time at a particular temperature is plotted along the ordinate. This graphical representation is used to illustrate the features associated with the relationship between crystallization-temperature and time for a variety of phase-change materials; it is, not a depiction of empirical results for a specific material. As such, neither specific temperature nor specific time values are given, only relative values are displayed.

In particular, the melting temperature T$_{EMELT}$ of the phase change material is represented by a broken vertical line labeled T$_{EMELT}$. At lower temperatures, the rate of crystallization increases from a minimal rate at a temperature T$_{ECRYMIN1}$ to a maximum rate at a temperature T$_{EOPTIMAL}$. Crystallization times (the inverse of crystallization rates), the time required to fully crystallize an active volume of phase change material within a cell at a given temperature, are displayed in FIG. 4A. Above the optimal crystallization temperature T$_{EOPTIMAL}$, the rate of crystallization falls off rapidly and, as the material's temperature approaches its melting temperature T$_{EMELT}$, the rate of crystallization drops to zero.

As indicated by the crystallization temperature curve of FIG. 4A, although the rate at which the material crystallizes declines rapidly to either side of the optimal temperature T$_{EOPTIMAL}$ (that is, at temperatures above or below T$_{EOPTIMAL}$), the crystallization rate declines more dramatically as the material's temperature rises above T$_{EOPTIMAL}$ than it does at temperatures below T$_{EOPTIMAL}$.

Individual memory cells within a memory array may respond differently to the same programming pulse, with some cells reaching higher temperatures than others. As a result, the programmed value of cells that are ostensibly programmed to the same value can vary from cell to cell. To reduce such variation in programmed value among the cells within an array, memories may be programmed to extremes. For a RESET operation, for example, memory cells may be programmed with a programming current pulse of a magnitude that is greater than that required to melt the phase change material within even the least-readily amorphized cell within an array, thereby ensuring that all cells within an array are fully RESET. For a SET operation, a SET-sweep programming pulse may be employed to yield uniform SET values across an array of cells.

A SET sweep programming pulse subjects all cells within an array to a range of temperatures that includes the optimal crystallization temperature $T_{EOPTIMAL}$. The SET sweep programming method is known and described, for example, in U.S. Pat. No. 6,625,054, entitled "METHOD AND APPARATUS TO PROGRAM A PHASE-CHANGE MEMORY," issued Sep. 23, 2003, to Lowrey et al, which is hereby incorporated by reference. A SET sweep programming method, including application to multi-level cells, is also described in U.S. Pat. No. 6,687,153, entitled, "PROGRAMMING A PHASE-CHANGE MATERIAL MEMORY," issued Feb. 3, 2004 to Lowrey, which is hereby incorporated by reference. In broad terms, a SET sweep programming method elevates the temperature of programmable resistance material, then gradually reduces the temperature of the material at a rate that ensures that all memory cells within an array are held at an elevated temperature long enough at various temperatures to ensure that even the least-readily crystallized cell is fully crystallized (that is, SET).

Employing a SET sweep method, the temperature of the phase change material within the cells may be elevated to, for example, the material's melting temperature $T_{EMELT}$. To RESET a cell, the programming current may be rapidly terminated after heating the material to its melting temperature $T_{EMELT}$. To SET a cell, the programming current is gradually reduced from the peak current that yielded the melting temperature $T_{EMELT}$, through a range of temperatures.

By gradually cooling a cell (e.g., over a period between 10 ns and 1000 ns), the cumulative effect of the cell being held at an elevated temperature will eventually SET the cell. Although different cells may be raised to different temperatures, all cells, including the least readily crystallized cells, are held within a range of temperatures for a sufficient period of time to ensure that all cells are fully crystallized (that is, fully SET). A multi-level cell implementation requires that at least one programming level is only "partially SET" and differences in cell temperatures and associated crystallization rates among the cells must be accommodated.

Figure 4B:
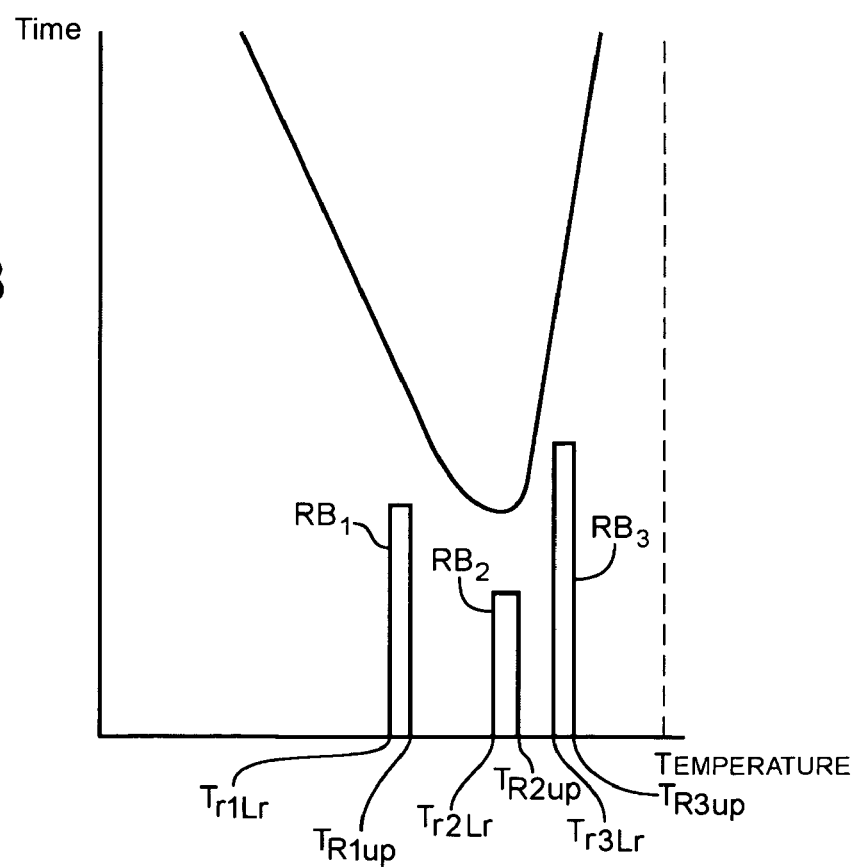

The time-at-temperature range-blocks of FIG. 4B represent different programming regimes that may be employed to bring a given programmable resistance memory cell to the same resistance value: a SET resistance value. In this and other Figures, the assumption is made that phase change material within a cells is brought to the high end of a temperature profile quite rapidly (e.g., within 5 ns) and, therefore, the upper bound of time-temperature range blocks is depicted as a straight line, rather than a sloped line. The programmed resistance value is a SET resistance in this illustrative embodiment.

In this illustrative embodiment, each range-block represents the same variance in temperature, with different endpoints. For example, a range may have a variance of 100° degrees with endpoints of 200° and 300°, 150° and 250°, etc. Within each range-block the phase change material is held at each temperature for equal periods of time, as indicated by the horizontal lines that define the tops of the range-blocks. In this representation, the assumption is made that the phase change material is rapidly brought to the highest temperature within a given range, cooled to the lower bound of its temperature range at an even rate, then rapidly cooled to a temperature below its crystallization temperature. For this reason, time-at-temperature outside the ranges is not included in the illustration. As will be described in greater detail in the discussion that follows, other temperature profiles are contemplated within the scope of the present invention.

A phase change material subjected to the temperatures within range 1 RB1, below the optimal crystallization temperature, requires a greater period of time to crystallize than if subjected to the temperatures of range 2 RB2, but a shorter period of time than if subjected to the temperatures of range 3 RB3. All of the depicted range-blocks are associated with greater crystallization periods than would be associated with holding the material at the optimal crystallization temperature $T_{EOPTIMAL}$ for the minimal crystallization time $T_{MINIMAL}$.

The material, when subjected to the temperatures of range 1, are crystallized over a period of time $\Delta t_1$ by the cumulative effects of time and temperature ($t_1$ ns at temperature $T_{r11r}$, $t_1$ ns at temperature $T_{r12}$, ... $t_1$ ns at temperature $T_{r1up}$); when subjected to the temperatures of range 2 are crystallized over a period of time $\Delta t_2$ by the cumulative effects of time and temperature ($t_2$ ns at temperature $T_{r21r}$, $t_2$ ns at temperature $T_{r22}$, ... $t_2$ ns at temperature $T_{r2up}$); and are crystallized over a period of time $\Delta t_3$ by the cumulative effects of time and temperature ($t_3$ ns at temperature $T_{r31r}$, $t_3$ ns at temperature $T_{r32}$, ... $t_3$ ns at temperature $T_{r3up}$). Between $T_{EOPTIMAL}$ and $T_{EMELT}$, the phase-change material's crystallization rate decreases rapidly and, as indicated by the height of range-block 3, substantially more time is required in temperature range 3 to achieve the same degree of crystallization as in temperature range 2. Although the phase-change material's crystallization rate decreases rapidly below $T_{OPTIMAL}$, the rate doesn't decrease as rapidly as it does above $T_{OPTIMAL}$. Consequently, although the time-to-crystallization (indicated, again, by the height of range-block 1) is greater in range 1 than in range 2, it is less than in range 3.

Figure 4C:
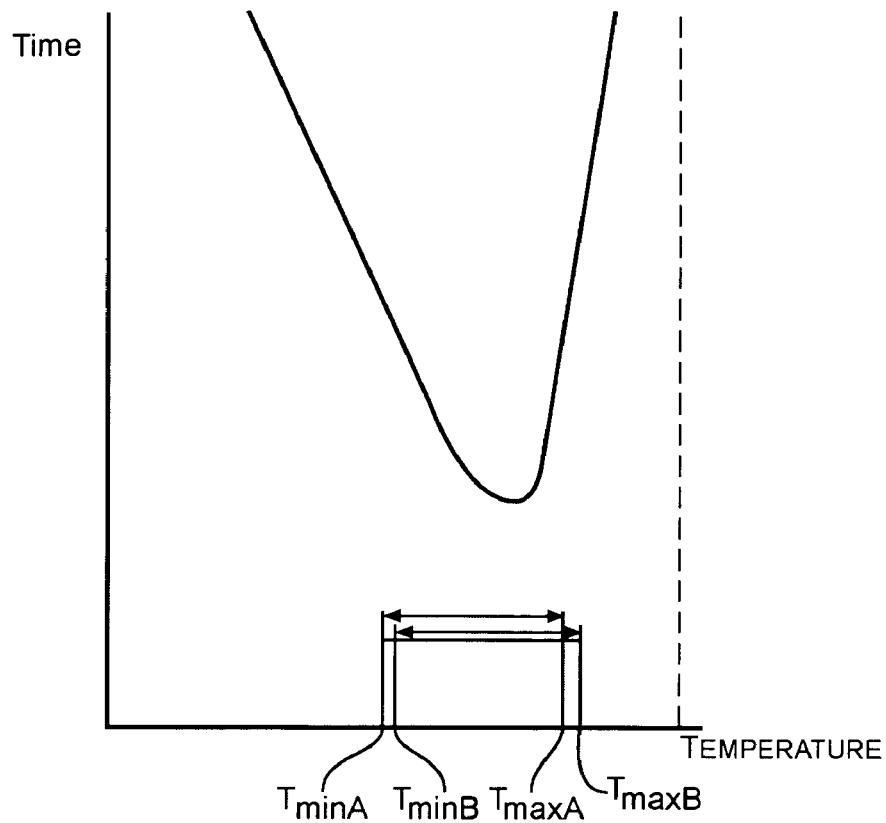

The temperature versus time graph of FIG. 4C plots time-at-temperature profiles for two programmable resistance cells. The plot having TMAX as an upper bound represents a cell within an array that is most readily amorphized. The plot having TMIN as an upper bound represents a cell within an array that is least readily amorphized. The relative ease with which a cell is amorphized may be correlated to the current supplied to the cell. The assumption is made that, for a given current, cell-by-cell variations (in structure or materials) yield different temperatures, with the least-readily amorphized cells requiring the most current to attain a given temperature.

In an illustrative embodiment in accordance with the principles of the present invention, current values IMAX and IMIN respectively corresponding to TMAX and TMIN may be determined during self-test or manufacturing test, for example. These current values may be stored within a programmable resistance memory in accordance with the principles of the present invention and used by the feedback control circuit 200 to tailor the current supplied to a programmable resistance memory cell in a manner that may minimize programming time while maximizing logic-state margins, as described in greater detail in the discussion related to FIGS. 5A through 5C.

The IMAX and IMIN current values for an entire array may be determined and stored for use by the feedback control circuit 200, for example. Alternatively, the IMAX and IMIN values may be determined for smaller groups of cells in order to provide a more precise record of programming current values for use by the feedback control system 200. The size of such blocks may range from a relatively small number of cells to, in the extreme, the entire programmable resistance array. Arrays that exhibit greater variability may determine and store such values on a more "fine-grained" basis, thereby allowing for closer matching of programming current and program state. Alternatively, a write, read, verify, rewrite to adjust algorithm may be employed. The rewrite may adjust the amplitude or the trailing edge to increase or decrease the resistance as desired.

Testing (self-, external-, or a combination of self-test and external-testing, during manufacturing or in the field), may be used to determine IMIN for each block of cells. Such testing may take the form of self-testing, external-testing, or a combination of self- and external-testing that may be performed during manufacturing or in the field, for example. The IMIN current value thus determined may be used by a phase change memory in accordance with the principles of the present invention to program a phase change memory cell to a crystalline state, with IMIN set as the upper bound. To that end, the peak current IMIN is selected to produce a temperature value as close to $T_{EOPTIMAL}$ as possible. IMIN may be adjusted to provide adequate margin.

By selecting the value of IMIN in this manner, programming time may be minimized by ensuring that the least-readily amorphized cell is subjected to a temperature profile that includes time at the optimal crystallization temperature $T_{EOPTIMAL}$, thereby accelerating the programming process. At the same time, current supplied to the most readily amorphized dell will be less likely to overheat the cell, than it would be if the upper bound were chosen, for example, so that IMIN yields a temperature equal to $T_{EMELT}$. Reducing the likelihood of overheating reduces mechanical stress in the cells, yielding greater reliability and longer cycle life for a memory array in accordance with the principles of the present invention. In this illustrative embodiment, the time at temperature for the TMINA-TMINB range block is substantially equal to that for the TMAXA-TMAXB range block. Read-verify algorithm may confirm whether a further write adjust is required.

As indicated by the abrupt termination at temperatures TMINA and TMAXA, a phase change memory cell may be fully programmed by raising the temperature of the phase change material, reducing the temperature of the cell at a steady rate, then, when fully programmed, quickly cooling the phase change material (at TMINA and TMAXA in the illustrative embodiment).

Abrupt termination of cell heating, such as illustrated at TMINA and TMAXA, may be implemented, for example, by quenching the programming current supplied to a cell that is being programmed. As described in the discussion related to FIG. 2, such quenching may employ a diversion circuit that steers current away from the cell being programmed. In an illustrative embodiment, a feedback control circuit in accordance with the principles of the present invention controls such quenching action. Adjustable inputs, such as those supplied to the comparison circuits described in the discussion related to FIG. 2 may be determined during a memory array test, such as a self-test. Such self-test may be conducted during a system power-up routine, for example.

By terminating/quenching programming current, the time required to program a cell may be significantly reduced. In an illustrative embodiment, the peak programming current employed by a feedback control programmable resistance memory in accordance with the principles of the present invention for non-RESET programming is limited to 75% of the value used for programming a RESET state (nominally, $I_{RESET}$) and programming current is terminated when the current falls to 25% of $I_{RESET}$.

Assuming a linear fall rate, such adjustments reduce the non-RESET programming time (that is, programming time for all states other than RESET) by approximately half and achieve the same or similar result as if not used. Further reductions in programming time may be achieved by tighter control of programming current levels which may be enabled by employing memory test results to set peak, cutoff, and rate values in a feedback control programmable resistance memory in accordance with the principles of the present invention. Such parameter values may vary from block to block, depending, for example, upon circuit test results.

Figure 4D:
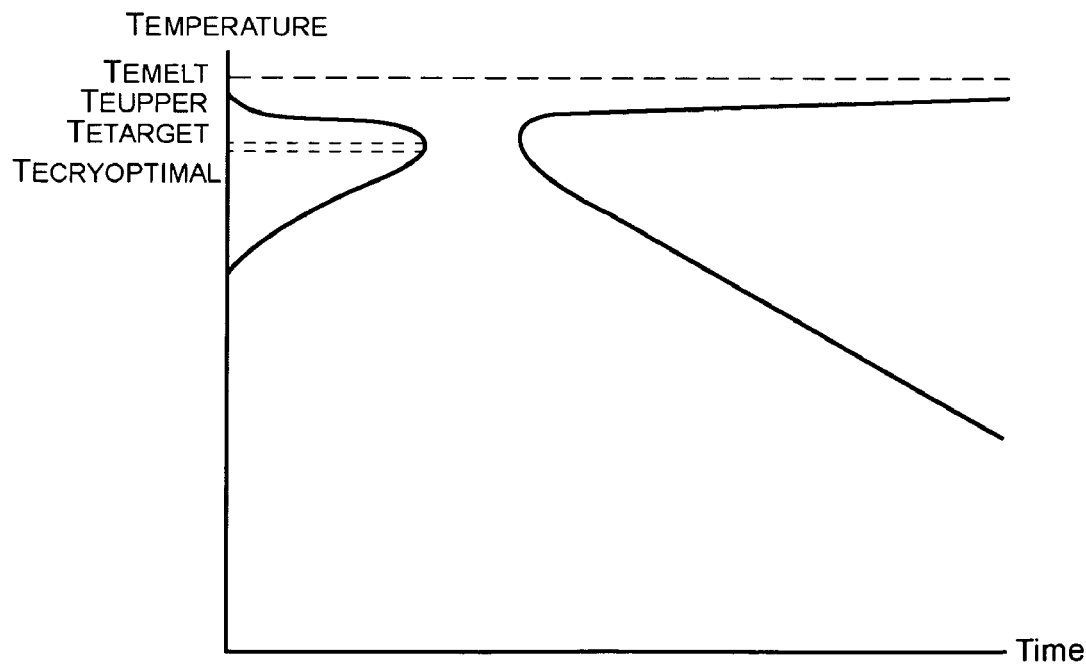

Although conventional SET sweep temperature profiles typically depict a cell temperature falling at an even rate, a feedback control system 200 in accordance with the principles of the present invention may be used to create a current or temperature profile wherein the time-at-temperature increases to a maximum at or near the optimal crystallization temperature $T_{EOPTIMAL}$ of a cell's phase change material, then falls, along with temperature, after transiting the material's "crystallization nose region," as depicted in the graph of FIG. 4D.

A feedback control system in accordance with the principles of the present invention may be employed to modulate current supplied to a cell in order to achieve the temperature profile depicted in FIG. 4D. The control system 200 may, for example, allow an initial surge of current to rapidly heat a cell's phase change material to the upper temperature level $T_{EUPPER}$. Once that temperature is reached, the feedback control system 200 reduces current through the cell, by diverting current through a quench transistor, for example, in order to bring the cell's temperature to temperature $T_{ETARGET}$. The temperature $T_{ETARGET}$ may be set as close to $T_{ECRYOPTIMAL}$ as possible. The current most likely to establish that temperature may be determined by array tests, as previously described. That value and/or parameter values employed by the feedback control circuit 200 may be stored within a programmable resistance array. And, as previously described, for tighter parameter control, such parameter values may be determined and stored for blocks that form a subset of an entire programmable resistance memory array.

In an illustrative embodiment, the target temperature $T_{ETARGET}$ is kept below $T_{EMELT}$, in order to minimize mechanical stress within a programmed memory cell. In this illustrative embodiment, the feedback control circuit 200 modulates current through the accessed device in a pattern that takes the cell's material through a desired temperature profile by increasing or decreasing current through the device. Such current modulation may be implemented by diverting more or less current through a quench transistor, for example.

Because the temperature of the phase change material will typically lag the level of current passing through a device, accommodation for such lag may be made in a feedback control circuit 200 in accordance with the principles of the present invention. Such current/temperature lag characteristics may be determined empirically or through device modeling, for example. Once determined, they may be used, for example, to set adjustable circuit values related to upper level current, quench level, and fall rate (that is, the rate at which programming temperature falls) within the feedback control circuit 200. By reducing, then increasing the fall rate at one or more temperature levels or, more precisely, corresponding current levels, the time/temperature profile of FIG. 4D may be produced by the feedback control circuit 200 in accordance with the principles of the present invention.

Figure 5A:
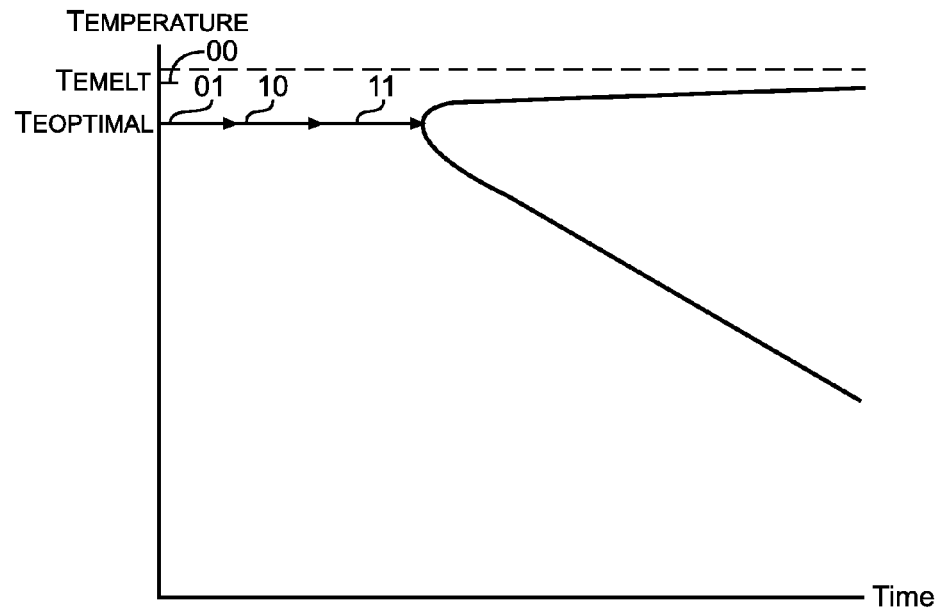
FIGS. 5A-5C are graphical representations of time-at-temperature for programming methods in accordance with the principles of the present invention.

The time-at-temperature plot of FIG. 5A depicts the programming of a multi-level phase change memory in accordance with the principles of the present invention. Temperature is plotted along the ordinate and cumulative time at a particular temperature is plotted along the abscissa. Four (or more) logic levels, representing, for example, binary states 00, 01, 10, and 11 are employed in this illustrative embodiment. As with two-level cell operation, the RESET level, corresponding to a 00 value in this illustrative embodiment, may be programmed by quickly bringing the material within the cell to the material's melting temperature, then rapidly reducing the material's temperature below $T_{EMELT}$ to "freeze" the material in the amorphous, high-resistance, state. Such an operation is represented by the trace labeled 00. The cell may be programmed to a fully SET state, a logic level 11 in this embodiment, by raising the temperature of the cell's phase change material to the material's optimal crystallization temperature $T_{EOPTIMAL}$ for the minimal period of time $T_{ISETMINIMUM}$. Intermediate states associated with logic levels 01 and 10 may be programmed by raising the temperature of the cell's material to $T_{EOPTIMAL}$ for respective periods of TIME01 and TIME10, for example.

Figure 5B:
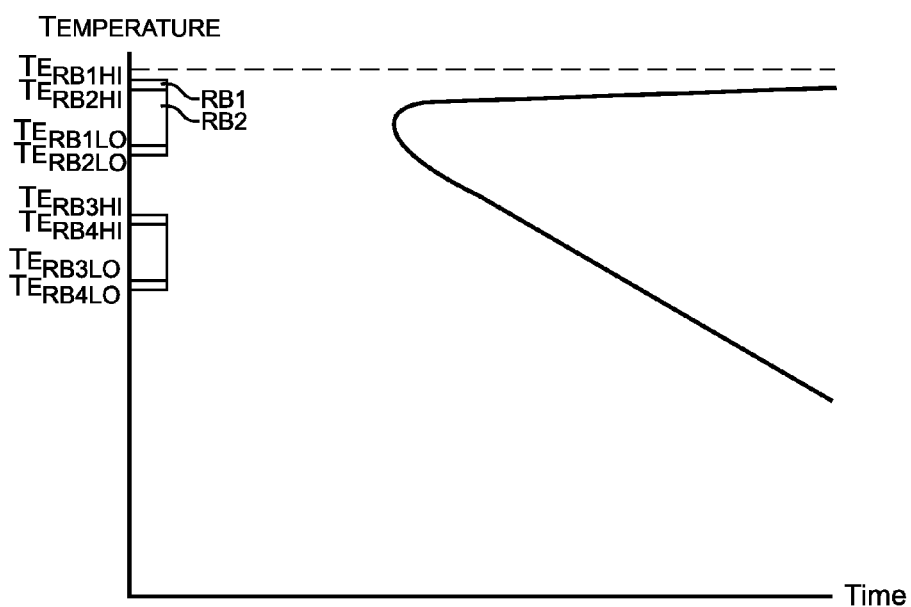

As previously discussed, $T_{EOPTIMAL}$ is the temperature at which crystallization takes place most rapidly. Phase change material may be crystallized at other temperatures, but, to achieve the same degree of crystallization, must be held at that temperature for a longer period of time. For a cell that is subjected to a range of temperatures, the cumulative time required to achieve the same degree of crystallization will be greater than the time for material held at $T_{EOPTIMAL}$. The time-at-temperature discussion and associated range-block description related to FIGS. 4A through 4D may be applied to a multi-level cell, such as one whose programming profile is depicted graphically in FIG. 5A. For example, the outlines of time-at-temperature profiles of FIG. 4C, depicting the variance of temperatures and programming profiles among an array of memory cells, could be applied to each of the non-RESET logic states, 01, 10, and 11, of FIG. 5A. FIG. 5B illustrates such application for the 10 logic level.

In FIG. 5B, temperature is plotted along the ordinate and cumulative time at a particular temperature is plotted along the abscissa. The trace labeled 10 represents the programming of a phase change memory cell to a 10 logic level using a minimal-time programming method. Using this programming approach, the phase change material within a cell is instantaneously raised to the optimal crystallization temperature $T_{EOPTIMAL}$, held at that temperature for a period of time that crystallizes the exact amount of material within the cell to yield precisely the nominal resistance associated with the 10 logic level, then instantaneously reduced to a temperature at which crystallization ceases. Such precise control of time-at-temperature would be difficult to achieve.

Additionally, because each cell may respond differently to current pulses of the same amplitude, the temperatures to which cells are raised may vary from cell to cell. For example, the temperature within one cell may be raised to the optimal crystallization temperature $T_{EOPTIMAL}$, while the temperature within another cell may be raised to the melting temperature $T_{EMELT}$. With a programming method that employs a very narrow range of programming temperatures, those cells that are heated to $T_{EOPTIMAL}$ will be precisely programmed to the target, nominal, logic level in the shortest period of time possible. However, those cells that reach different temperatures will not be programmed to the target level. Because the crystallization rate falls more rapidly as the phase change material exceeds $T_{EOPTIMAL}$ than it does below $T_{EOPTIMAL}$, those cells that are heated to a temperature above $T_{EOPTIMAL}$ will likely be programmed to a level that diverges farther from the target programming level than those that are heated to a level below $T_{EOPTIMAL}$.

If, instead of employing an extremely narrow range of programming temperatures, as is depicted in the graphical representation of FIG. 5A, a broader range of temperatures is employed, as in the graphical representation of FIG. 5B, some of the variability in programming results may be avoided; the tradeoff is that the time required to program a cell may be increased. In FIG. 5B range blocks RB1, RB2, RB3, and RB4 represent programming methods that may be employed to program phase change cells to a logic level 10. Range block RB1 ranges from temperature $T_{ERB1HI}$ to $T_{ERB1LO}$, range block RB2 ranges from temperature $T_{ERB2HI}$ to $T_{ERB2LO}$, range block RB3 ranges from temperature $T_{ERB3HI}$ to $T_{ERB3LO}$, and range block RB4 ranges from temperature $T_{ERB4HI}$ to $T_{ERB4LO}$.

Range blocks RB1 and RB2 are meant to represent an approach to programming a logic level 10 in which the temperature of programmable resistance material within a phase change memory cell is raised to a level above the optimal crystallization temperature $T_{EOPTIMAL}$. Range blocks RB3 and RB4 represent an approach to programming a logic level 10 in which the temperature of programmable resistance material within a phase change memory cell is raised to a level below the optimal crystallization temperature $T_{EOPTIMAL}$.

The difference in temperature ranges between range blocks RB1 and RB2 represents the spread in temperatures that may result from cell-to-cell variation in responses to a given programming pulse. Similarly, the difference in temperature ranges between range blocks RB3 and RB4 represents the spread in temperatures that may result from cell-to-cell variation in responses to a given programming pulse.

Although the range blocks of FIG. 5B illustrate equal temperature distributions, with equal time spent at each temperature within the range block, other approaches may be employed. Programming methods may employ the same temperature range for all logic levels, with time spent at those temperatures varied to achieve different programming levels. A programming method may operate to program different logic levels, with the same time spent at all temperatures, but with different temperature ranges for each logic level. These and other programming methods are contemplated within the scope of the invention. Alternatively, a write, read-verify, rewrite/adjust algorithm may be used to further adjust each bit after writing, where the amplitude or trailing edge are adjusted by varying the resistance Radj1 and 3 (or forcing different voltages into those inputs). Raising the amplitude allows higher resistance and slowing the trailing edge rate allows lower resistance, and using these variables the intermediate levels may be adequately achieved with multiple re-writes based on read-verify.

In the programming method represented by range blocks RB1 and RB2, phase change memory cells are raised to a temperature within the range defined by $T_{ERB1HI}$ and $T_{ERB2HI}$, then reduced at a steady rate through a temperature range that encompasses the phase change material's optimal crystallization temperature $T_{EOPTIMAL}$, terminating, respectively at temperatures $T_{ERB1LO}$ and $T_{ERB2LO}$. In the programming method represented by range blocks RB3 and RB4, phase change memory cells are raised to a temperature within the range defined by $T_{ERB3HI}$ and $T_{ERB4HI}$, then reduced at a steady rate through a temperature range that does not include the phase change material's optimal crystallization temperature $T_{EOPTIMAL}$, terminating, respectively at temperatures $T_{ERB3LO}$ and $T_{ERB4LO}$.

The programming method represented by range blocks R1 and R2 is a form of multi-level SET sweep programming method, with all cells within an array heated to a level above $T_{EOPTIMAL}$, then cooled at a rate that exposes all cells within an array to substantially the same period of time with the cells' nose temperature range (that is, in a range within 50° C. above and below $T_{EOPTIMAL}$). In this manner, the distribution of programmed values within an array of cells may be more tightly controlled than other programming methods may afford, because the bulk of programming action takes place as each cell transits the nose region, and all cells, because of their equal rate of temperature decline, spend approximately the same period of time within the nose region.

The region between temperatures $T_{ERB1HI}$ and $T_{ERB2HI}$ indicates the spread in temperature among memory cells subjected to the same programming current. Using a programming method in accordance with the principles of the present invention range blocks RB1 and RB2 may be positioned toward the upper end of the temperature distribution. Because crystallization rates drop off dramatically above $T_{EOPTIMAL}$ employing programming temperature-regions in this manner limits the effect of cell-to-cell spread; the difference in crystallization that takes place within cells raised between $T_{ERB1HI}$ and $T_{ERB2HI}$ may be treated as a "don't care" condition in an illustrative programming method in accordance with the principles of the present invention. The reduced sensitivity to peak cell temperatures within this programming region implies that a plurality of cells within an array may be programmed with a programming pulse of the same amplitude, with little consequence as to crystallization distribution (that is, the difference between crystallization attributable to the difference between $T_{ERB1HI}$ and $T_{ERB2HI}$) among the programmed cells.

This programming approach may be thought of as a form of multi-level SET sweep programming, with all cells within an array heated to a level above $T_{EOPTIMAL}$, then cooled at a rate that exposes all cells within an array to substantially the same period of time within the cells' nose temperature range (that is, in a range within 50° C. above and below $T_{EOPTIMAL}$). In this manner, the distribution of programmed values within an array of cells may be more tightly controlled than other programming methods may afford, because the bulk of programming action takes place as each cell transits the nose region, and all cells, because of their equal rate of temperature decline, spend approximately the same period of time within the nose region.

At the lower temperatures of the range blocks, the crystallization distribution (that is, the difference between crystallization attributable to the difference between $T_{ERB1LO}$ and $T_{ERB2LO}$) may be narrowed by terminating programming current on a block by block basis. As previously described, current-termination levels may be determined on a block by block basis using empirical means. A feedback control circuit in accordance with the principles of the present invention and, in particular, one that employs a current-quenching circuit, may be adjusted to terminate programming current pulses according to such stored information. The combination of programming at a higher temperature range, where the distribution of temperatures within cells at the upper end of the range has little effect on the crystallization distribution among cells, and employing current-quench levels that are tailored to different groups of cells provides tighter control over program level distributions, thereby increasing margins in a phase change memory multi-level logic implementation in accordance with the principles of the present invention.

The programming method represented by range blocks R3 and R4, does not take programmed cells through a temperature range that includes the phase change material's nose temperature region and the temperature distributions at both the upper levels, between $T_{ERB3HI}$ and $T_{ERB4HI}$, and lower levels, between $T_{ERB3LO}$ and $T_{ERB4LO}$, will contribute to differences in crystallization levels among programmed cells. Additionally, because the temperature distributions fall within ranges where crystallization rates vary significantly, the resultant spread in programmed levels could be substantial.

As with the methods associated with range blocks RB1 and RB2, the differences between $T_{ERB3LO}$ and $T_{ERB4LO}$ could be reduced by use of block-by-block current-quenching as previously described. Nevertheless, because this method may result in wider distributions of programmed values, it may be more suitable for multi-level logic applications that feature large inter-logic level margins. Additionally, because programming takes place at lower temperatures, this programming approach may provide for greater endurance. That is, with lower programming temperatures, less mechanical stress is imposed upon memory cells and the endurance of cells, in terms of the number of write cycles, may be increased in comparison with programming methods that employ higher programming temperatures.

Figure 5C:
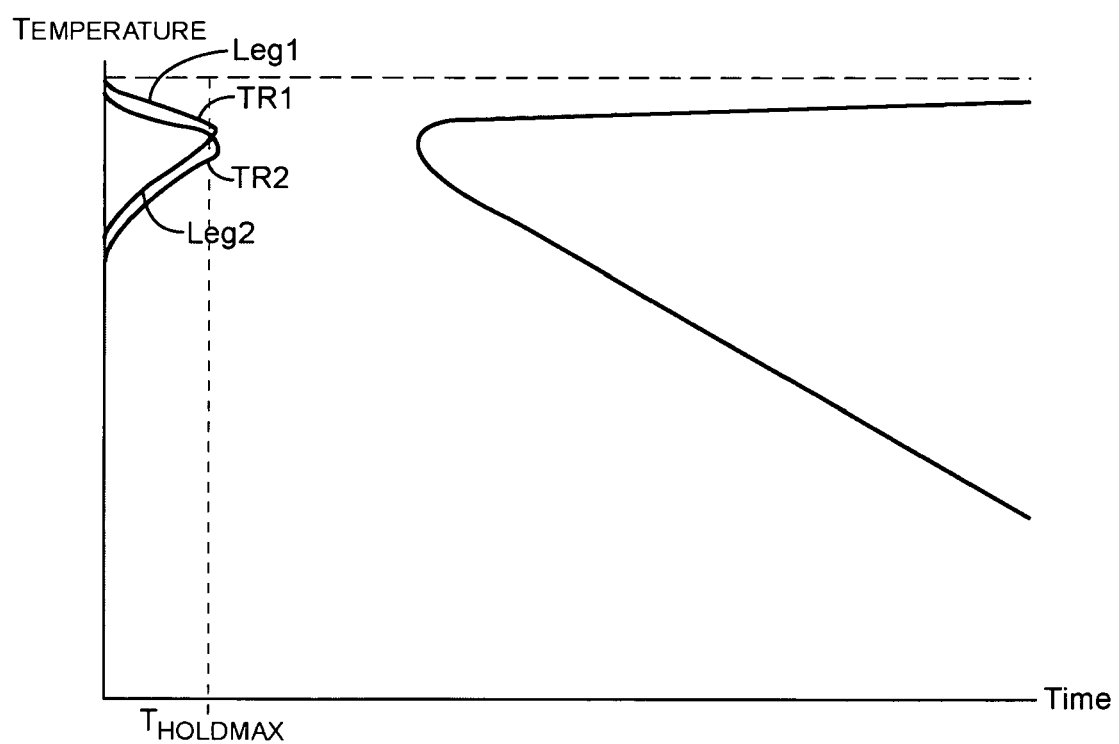

In an alternative programming method in accordance with the principles of the present invention and cells are brought to a peak temperature, swept through lower temperatures at a decreasing rate until they've reached a temperature at which they are held for a maximum period of time, then swept through lower temperatures at an increasing rate. The result is a time-at-temperature diagram such as depicted in FIG. 5C, in which temperature is along the ordinate and cumulative time is along the abscissa. In an illustrative embodiment, the method uses the optimal crystallization temperature $T_{EOPTIMAL}$ as the target for the temperature at which the cell is held longest: for a period $T_{HOLDMAX}$.

The two somewhat triangular-shaped cumulative time plots TR1 and TR2 represent the upper and lower bounds of cell temperature distributions resulting from the application of identical programming current pulses. A feedback control circuit 200 in accordance with the principles of the present invention may adjust the rate of current increase and decrease in order to create time-at-temperature profiles such as TR1 and TR2. In particular, according to an illustrative embodiment, a peak current is applied to a selected cell to heat the cell to a corresponding peak temperature. Current through the cell is diminished in order to lower the temperature within the cell. By decreasing the rate at which current through a cell is diminished, the cell is subjected to falling temperatures for increasingly longer periods of time (represented by LEG1) until a target current is reached that is intended to generate the optimal crystallization temperature $T_{EOPMTIMAL}$ within the cell. In this illustrative embodiment, the feedback control circuit 200 holds the current within the cell at this level for the longest period of time $T_{HOLDMAX}$. Afterwards, the feedback control circuit 200 increases the rate at which current through the cell is diminished (represented by LEG2). In this illustrative multi-level logic embodiment, the time-at-temperature profiles TR1 and TR2 represent the distribution of programming pulses directed at programming a logic level 10. Other logic levels may be programmed, for example, using longer (for logic level 11) or shorter (for logic level 01) periods characterized by greater or lesser values of $T_{HOLDMAX}$.

Figure 6:
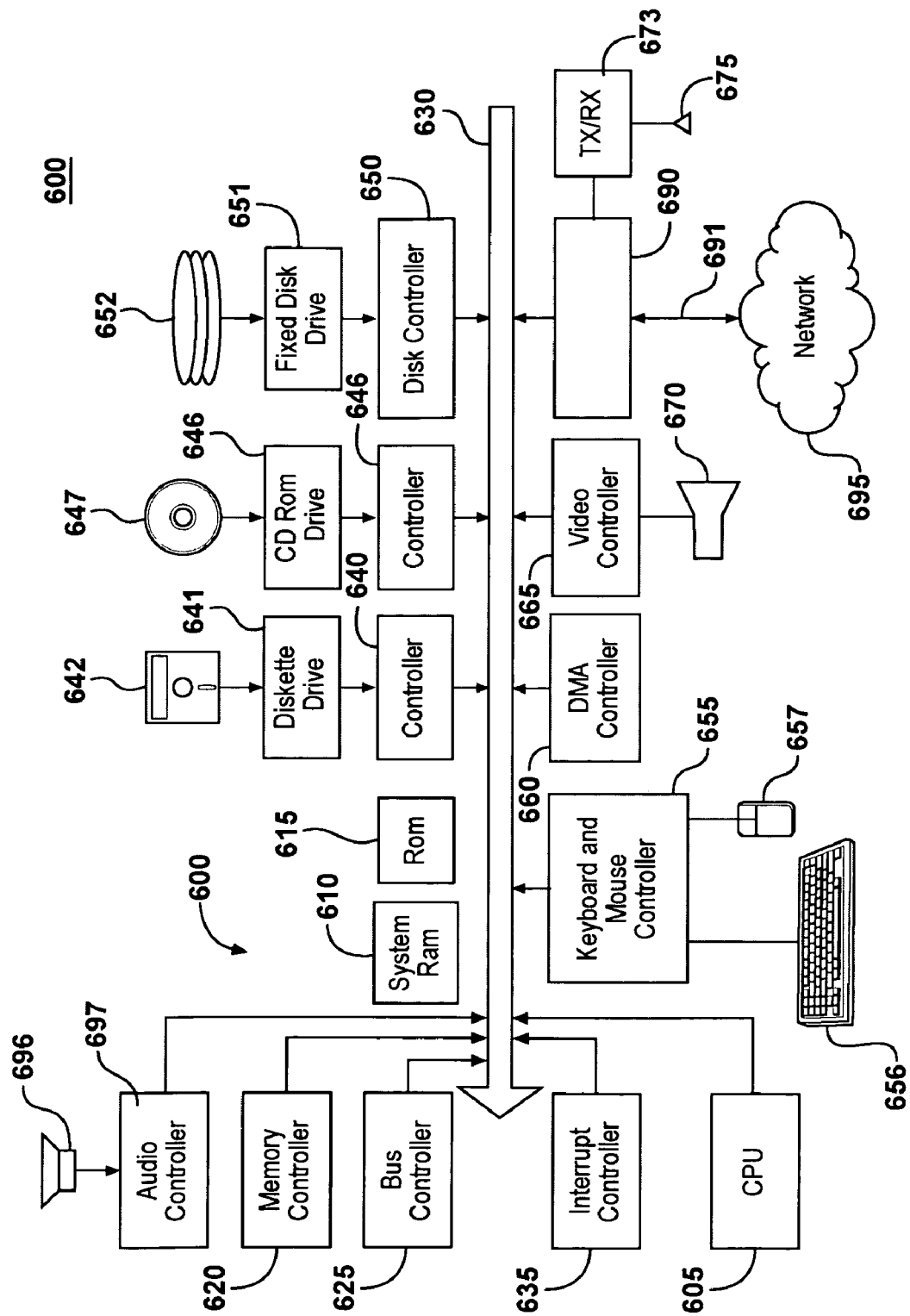
FIG. 6 is a conceptual block diagram of an electronic system such as may employ programmable resistance memories in accordance with the principles of the present invention.

The feedback control programmable resistance memory described in the discussion related to the previous figures may be employed to particular advantage in a wide variety of systems. The schematic diagram of FIG. 6 will be discussed to illustrate the devices' use in a few such systems. The schematic diagram of FIG. 6 includes many components and devices, some of which may be used for specific embodiments of a system in accordance with the principles of the present invention and while others not used. In other embodiments, other similar systems, components and devices may be employed. In general, the system includes logic circuitry configured to operate along with programmable resistance memory which may include phase change memory. The logic circuitry may be discrete, programmable, application-specific, or in the form of a microprocessor, microcontroller, or digital signal processor, for example. In some embodiments, the logic circuitry may be implemented using thin film logic. And the embodiments herein may also be employed on integrated chips or connected to such circuitry. The exemplary system of FIG. 6 is for descriptive purposes only. Although the description may refer to terms commonly used in describing particular computer, communications, tracking, and entertainment systems; the description and concepts equally apply to other systems, including systems having architectures dissimilar to that illustrated in FIG. 6. The electronic system 600, in various embodiments, may be implemented as, for example, a general purpose computer, a router, a large-scale data storage system, a portable computer, a personal digital assistant, a cellular telephone, an electronic entertainment device, such as a music or video playback device or electronic game, a microprocessor, a microcontroller, a digital signal processor, or a radio frequency identification device. Any or all of the components depicted in FIG. 6 may employ a programmable resistance memory or a chalcogenide electronic device, such as a chalcogenide-based nonvolatile memory and/or threshold switch, for example.

In an illustrative embodiment, the system 600 may include a central processing unit (CPU) 605, which may be implemented with some or all of a microprocessor, a random access memory (RAM) 610 for temporary storage of information, and a read only memory (ROM) 615 for permanent storage of information. A memory controller 620 is provided for controlling RAM 610. In accordance with the principles of the present invention, all of, or any portion of, any of the memory elements (e.g. RAM or ROM) may be implemented as a programmable resistance memory which may include chalcogenide-based nonvolatile memory.

An electronic system 600 in accordance with the principles of the present invention may be a microprocessor that operates as a CPU 605, in combination with embedded chalcogenide-based electronic nonvolatile, memory that operates as RAM 610 and/or ROM 615, or as a portion thereof. In this illustrative example, the microprocessor/chalcogenide-nonvolatile memory combination may be standalone, or may operate with other components, such as those of FIG. 6 yet-to-be described.

In implementations within the scope of the invention; a bus 630 interconnects the components of the system 600. A bus controller 625 is provided for controlling bus 630. An interrupt controller 635 may or may not be used for receiving and processing various interrupt signals from the system components. Such components as the bus 630, bus controller 625, and interrupt controller 635 may be employed in a large-scale implementation of a system in accordance with the principles of the present invention, such as that of a standalone computer, a router, a portable computer, or a data storage system, for example.

Mass storage may be provided by diskette 642, CD ROM 647, or hard drive 652. Data and software may be exchanged with the system 600 via removable media such as diskette 642 and CD ROM 647. Diskette 642 is insertable into diskette drive 641 which is, in turn, connected to bus 630 by a controller 640. Similarly, CD ROM 647 is insertable into CD ROM drive 646 which is, in turn, connected to bus 630 by controller 645. Hard disc 652 is part of a fixed disc drive 651 which is connected to bus 630 by controller 650. Although conventional terms for storage devices (e.g., diskette) are being employed in this description of a system in accordance with the principles of the present invention, any or all of the storage devices may be implemented using programmable resistance memory which may include chalcogenide-based nonvolatile memory in accordance with the principles of the present invention. Removable storage may be provided by a nonvolatile storage component, such as a thumb drive, that employs a chalcogenide-based nonvolatile memory in accordance with the principles of the present invention as the storage medium. Storage systems that employ chalcogenide-based nonvolatile memory as "plug and play" substitutes for conventional removable memory, such as disks or CD ROMs or thumb drives, for example, may emulate existing controllers to provide a transparent interface for controllers such as controllers 640, 645, and 650, for example.

User input to the system 600 may be provided by any of a number of devices. For example, a keyboard 656 and mouse 657 are connected to bus 630 by controller 655. An audio transducer 696, which may act as both a microphone and/or a speaker, is connected to bus 630 by audio controller 697, as illustrated. Other input devices, such as a pen and/or tablet may be connected to bus 630 and an appropriate controller and software, as required, for use as input devices. DMA controller 660 is provided for performing direct memory access to RAM 610, which, as previously described, may be implemented in whole or part using chalcogenide-based nonvolatile memory devices in accordance with the principles of the present invention. A visual display is generated by video controller 665 which controls display 670. The display 670 may be of any size or technology appropriate for a given application.

In a cellular telephone or portable entertainment system embodiment, for example, the display 670 may include one or more relatively small (e.g. on the order of a few inches per side) LCD displays. In a large-scale data storage system, the display may be implemented as large-scale multi-screen, liquid crystal displays (LCDs), or organic light emitting diodes (OLEDs), including quantum dot OLEDs, for example.

The system 600 may also include a communications adaptor 690 which allows the system to be interconnected to a local area network (LAN) or a wide area network (WAN), schematically illustrated by bus 691 and network 695. An input interface 699 operates in conjunction with an input device 693 to permit a user to send information, whether command and control, data, or other types of information, to the system 600. The input device and interface may be any of a number of common interface devices, such as a joystick, a touch-pad, a touch-screen, a speech-recognition device, or other known input device. In some embodiments of a system in accordance with the principles of the present invention, the adapter 690 may operate with transceiver 673 and antenna 675 to provide wireless communications, for example, in cellular telephone, RFID, and wifi computer implementations.

Operation of system 600 is generally controlled and coordinated by operating system software. The operating system controls allocation of system resources and performs tasks such as processing scheduling, memory management, networking, and I/O services, among other things. In particular, an operating system resident in system memory and running on CPU 605 coordinates the operation of the other elements of the system 600.

In illustrative handheld electronic device embodiments of a system 600 in accordance with the principles of the present invention, such as a cellular telephone, a personal digital assistance, a digital organizer, a laptop computer, a handheld information device, a handheld entertainment device such as a device that plays music and/or video, small-scale input devices, such as keypads, function keys and soft keys, such as are known in the art, may be substituted for the controller 655, keyboard 656 and mouse 657, for example. Embodiments with a transmitter, recording capability, etc., may also include a microphone input (not shown).

In an illustrative RFID transponder implementation of a system 600 in accordance with the principles of the present invention, the antenna 675 may be configured to intercept an interrogation signal from a base station at a frequency $F_1$. The intercepted interrogation signal would then be conducted to a tuning circuit (not shown) that accepts signal $F_1$ and rejects all others. The signal then passes to the transceiver 673 where the modulations of the carrier $F_1$ comprising the interrogation signal are detected, amplified and shaped in known fashion. The detected interrogation signal then passes to a decoder and logic circuit which may be implemented as discrete logic in a low power application, for example, or as a microprocessor/memory combination as previously described. The interrogation signal modulations may define a code to either read data out from or write data into a chalcogenide-based nonvolatile memory in accordance with the principles of the present invention. In this illustrative embodiment, data read out from the memory is transferred to the transceiver 673 as an "answerback" signal on the antenna 675 at a second carrier frequency $F_2$. In passive RFID systems, power is derived from the interrogating signal and memory such as provided by a chalcogenide-based nonvolatile memory in accordance with the principles of the present invention is particularly well suited to such use. The term controller may be used herein in reference to various embodiments, including discrete logic, bit slice, microcontroller, microprocessor, array logic, or multi-core controllers, for example.

I claim:

1. An apparatus, comprising:
   an array of programmable resistance memory cells, said memory cells being programmable by application of a current; and
   feedback control circuitry configured to control the current supplied to a memory cell of said array, said feedback control circuitry including circuitry configured to (i) control a first peak current supplied to said memory cell; (ii) rapidly increase the current supplied to said memory cell up to a second peak current and then rapidly decrease current supplied to said memory cell to program said memory cell to a high resistance state; (iii) rapidly increase the current supplied to said memory cell up to a third peak current and then gradually decrease the current supplied to said memory cell to program said memory cell to a low resistance state; (iv) rapidly increase the current supplied to said memory cell up to a fourth peak current and then decrease the current supplied to said memory cell at an intermediate rate to program said memory cell to an intermediate resistance state; and (v) quench the current supplied to said memory cell when a predetermined level is reached.

2. The apparatus of claim 1, wherein said feedback control circuitry further includes circuitry configured to control the rate of change in the current supplied to said memory cell.

3. The apparatus of claim 1, wherein said feedback control circuitry further includes circuitry configured to use feedback to control the rate of decrease of current from said third peak current to program said low resistance state.

4. The apparatus of claim 1, wherein said feedback control circuitry further includes circuitry configured to use feedback to program said memory cell to said intermediate resistance state.

5. An apparatus, comprising:
   an array of phase-change memory cells, said memory cells being programmable by application of a current;
   feedback control circuitry configured to control the current supplied to a memory cell of said array, said feedback control circuitry including circuitry configured to (i) control a first peak current supplied to said memory cell; (ii) store one or more parameter values in response to an optimization process; and (iii) control a second peak current supplied to said memory cell when programming said memory cell to a high resistance state such that said second peak current is the minimal current sufficient to melt the phase change material within the least readily RESET operational memory cell within said array plus a margin; and
   storage configured to store said one or more parameter values, said feedback control circuitry configured to employ said stored one or more parameter values to control current supplied to said memory cell.

6. The apparatus of claim 5, further comprising self-test circuitry configured to perform an optimization process to determine said one or more parameter values.

7. The apparatus of claim 5, wherein said margin is less than 100% of the minimal current.

8. The apparatus of claim 5, wherein said feedback control circuitry is further configured to use feedback to control the rate of decrease in said current from said first peak current or said second peak current.

9. The apparatus of claim 8, wherein said feedback control circuitry is configured to control said decrease in said feedback-controlled current at more than two rates, each of said more than two rates corresponding to a different programming level of said memory cell.

10. The apparatus of claim 8, wherein said feedback control circuitry is configured to initiate a quench the current used to program said memory cell to a first programming state, said quench initiating when said current used to program said memory cell corresponds to a current level at which the memory cell of said array whose phase change material reached the highest temperature during programming to said first programming state has descended through a nose temperature region.

11. The apparatus of claim 10, wherein said feedback control circuitry is configured to initiate said quench when said current used to program said memory cell corresponds to a current level less than the current associated with the bottom of said nose temperature region.

12. An electronic system, comprising:
   an array of programmable resistance memory cells, said memory cells being programmable by application of a current;
   feedback control circuitry configured to control the current supplied to a memory cell of said array, said feedback control circuitry including circuitry configured to (i)

rapidly increase the current supplied to said memory cell up to a first peak current and then rapidly decrease the current supplied to said memory cell to program said memory cell to a high resistance state; (ii) rapidly increase the current supplied to said memory cell up to a second peak current and then gradually decrease the current supplied to said memory cell to program said memory cell to a low resistance state; and (iii) quench the current supplied to said memory cell when a predetermined level is reached; and a controller configured to access said memory array.

13. The electronic system of claim 12, wherein said feedback control circuitry is further configured to decrease the current supplied to said memory cell at an intermediate rate to program said memory cell to an intermediate resistance state.

14. The electronic system of claim 12, wherein said memory cells are phase change memory cells.

15. The electronic system of claim 12, further comprising a transceiver configured to transmit data from said memory array.

16. The electronic system of claim 15, wherein said memory array, said controller and said transceiver are configured as a cellular telephone.

17. The electronic system of claim 12, wherein said memory array and said controller are configured as a handheld entertainment device.

18. The electronic system of claim 12, wherein said memory array and said controller are configured as a solid state drive (SSD).

19. A method comprising the steps of:
supplying current to a memory cell of an array of programmable resistance memories;
monitoring said current; and
employing feedback control to adjust said current, said feedback control including (i) controlling a first peak current supplied to said memory cell being programmed; (ii) rapidly increasing the current supplied to said memory cell up to a second peak current and then rapidly decreasing the current supplied to said memory cell to program said memory cell to a high resistance state; (iii) rapidly increasing the current supplied to said memory cell up to a third peak current and then gradually decreasing the current supplied to said memory cell to program said memory cell to a low resistance state; (iv) rapidly increasing the current supplied to said memory cell up to a fourth peak current and then decreasing the current supplied to said memory cell at an intermediate rate to program said memory cell to an intermediate resistance state; and (v) quenching the current supplied to said memory cell when a predetermined level is reached.

20. The method of claim 19, wherein the step of employing feedback control includes the step of controlling the rate of change in the current supplied to said memory cell.

21. The method of claim 19, wherein the step of employing feedback control includes the step of storing parameter values and employing the parameter values to control the current supplied to said memory cell.

22. The method of claim 21, wherein the step of employing feedback control includes the step of storing parameter values developed during an optimization process.

23. The method of claim 19, wherein the step of supplying current to said memory cell includes the step of supplying current to a phase change memory cell.

* * * * *